United States Patent
Marshall et al.

(10) Patent No.: US 7,642,144 B2
(45) Date of Patent: Jan. 5, 2010

(54) TRANSISTORS WITH RECESSED ACTIVE TRENCHES FOR INCREASED EFFECTIVE GATE WIDTH

(75) Inventors: Andrew Marshall, Dallas, TX (US); Gabriel George Barna, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 197 days.

(21) Appl. No.: 11/644,259

(22) Filed: Dec. 22, 2006

(65) Prior Publication Data

US 2008/0153218 A1    Jun. 26, 2008

(51) Int. Cl.
*H01L 21/8234* (2006.01)

(52) U.S. Cl. .................. 438/197; 438/219; 438/221; 257/259

(58) Field of Classification Search ............... 438/197, 438/219, 221; 257/259
See application file for complete search history.

(56) References Cited

U.S. PATENT DOCUMENTS

| | | |
|---|---|---|
| 6,281,555 B1 | 8/2001 | Yu et al. |
| 6,746,933 B1 | 6/2004 | Beintner et al. |
| 6,913,969 B2 | 7/2005 | Yoo |
| 6,960,818 B1 | 11/2005 | Rengarajan et al. |
| 2002/0135025 A1 | 9/2002 | Park |
| 2004/0119142 A1 | 6/2004 | Grossi et al. |
| 2005/0186740 A1 | 8/2005 | Kim |
| 2006/0040462 A1 | 2/2006 | Wu et al. |

2008/0081404 A1    4/2008 Barna et al.

OTHER PUBLICATIONS

"Fin-Channel-Array Transistor (FCAT) Featuring Sub-70nm Low Power and High Performance DRAM", Deok-Hyung Lee, Byung-Chan Lee, In-Soo Jung, Taek Jung Kim, Yong-Hoon Son, Sun-Shil Lee, Young-Phil Kim, Siyoung Choi, U-In Chung and Joo-Tae Moon, IEEE, IEDM May 2003, 4 pgs.
"Static Noise Margin of the Full DG-CMOS SRAM Cell Using Bulk FinFETs (Omega MOSFETs)", T. Park, H.J. Cho, J.D. Choe, S.Y. Han, S.-M. Jung, J.H. Jeong, B.Y. Nam, O.I. Kwon, J.N. Han, H.S. Kang, M.C. Chae, G.S. Yeo, S.W. Lee, D.Y. Lee, D. Park, K. Kim E. Yoon and J.H. Lee, IEEE IEDM May 2003, 4 pgs.
"Fabrication of Body-Tied FinFETs (Omega MOSFETs) Using Bulk Si Wafers", T. Park, S. Choi, D.H. Lee, J.R. Yoo, B.C. Lee, J.Y. Kim, C.G. Lee, K.K. Chi, S.H. Hong, S.J. Hyun, Y.G. Shin, J.N. Han, I.S. Park, U.I. Chung, J.T. Moon, E. Yoon and J.H. Lee, 2003 Symposium on FLXI Technology Digest of Technical Papers, 2 pgs.
"Device Characteristics of Scaled Planar and Non-Planar CMOS Transistors for Sub-65nm Technology Generation" Jeong-Hwan Yang, TD P/J, Technology Development System LSI Division, Oct. 22, 2003, 78 pgs.

*Primary Examiner*—Thanh V Pham
(74) *Attorney, Agent, or Firm*—Warren L. Franz; Wade J. Brady, III; Frederick J. Telecky, Jr.

(57) ABSTRACT

A method of manufacturing a semiconductor device having recessed active trenches by providing a substrate with STI and active regions, forming a first oxide layer on the substrate, forming an nitride layer on the first oxide layer, employing a photolithographic process to create at least one recessed active trench through the first oxide layer and the nitride layer and into the substrate to create an isolation region, wherein the at least one trench is perpendicular to at least one gate structure in an active area of the substrate, layering the trench with a second oxide layer, removing the first oxide layer and second oxide layer, forming a third oxide layer on the planar substrate with recessed active trench, and forming the at least one circuitous gate structure on the third oxide layer connecting at least one electronic source and drain.

17 Claims, 11 Drawing Sheets

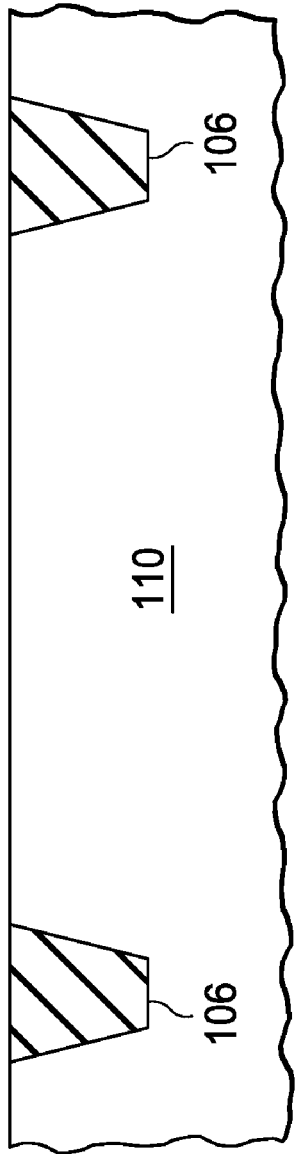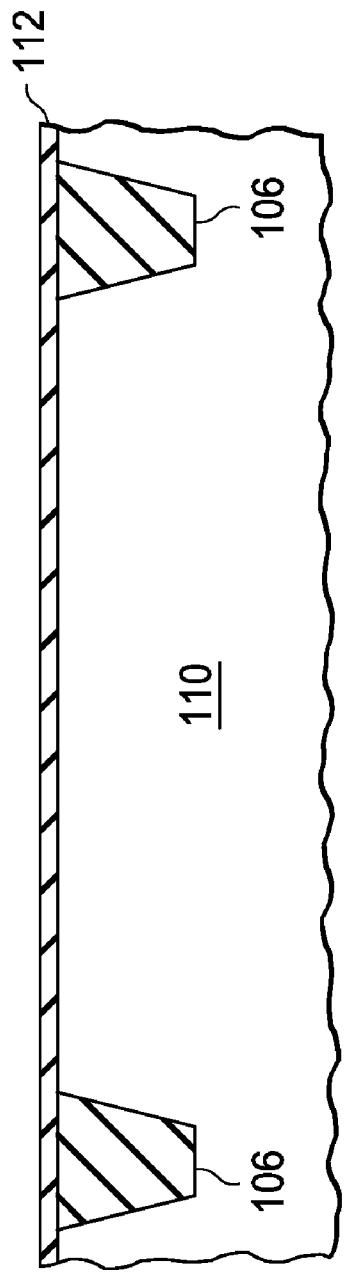

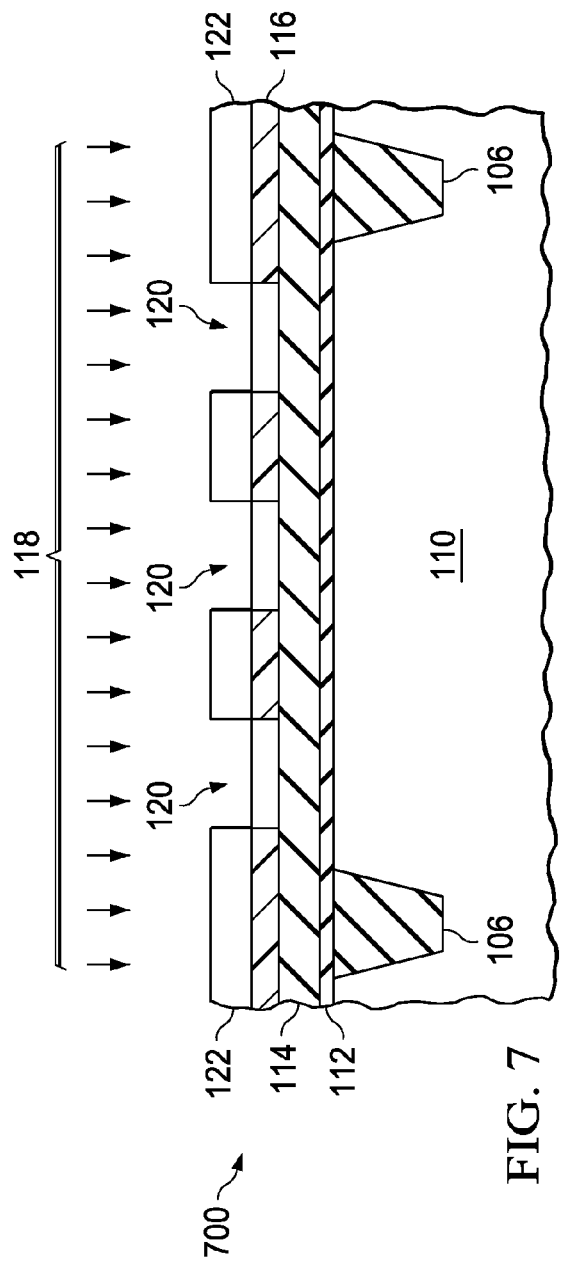
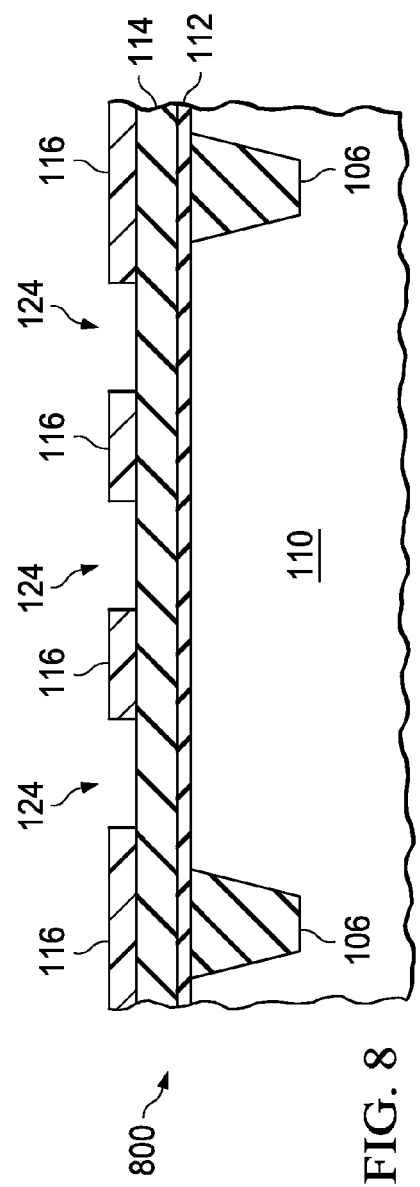

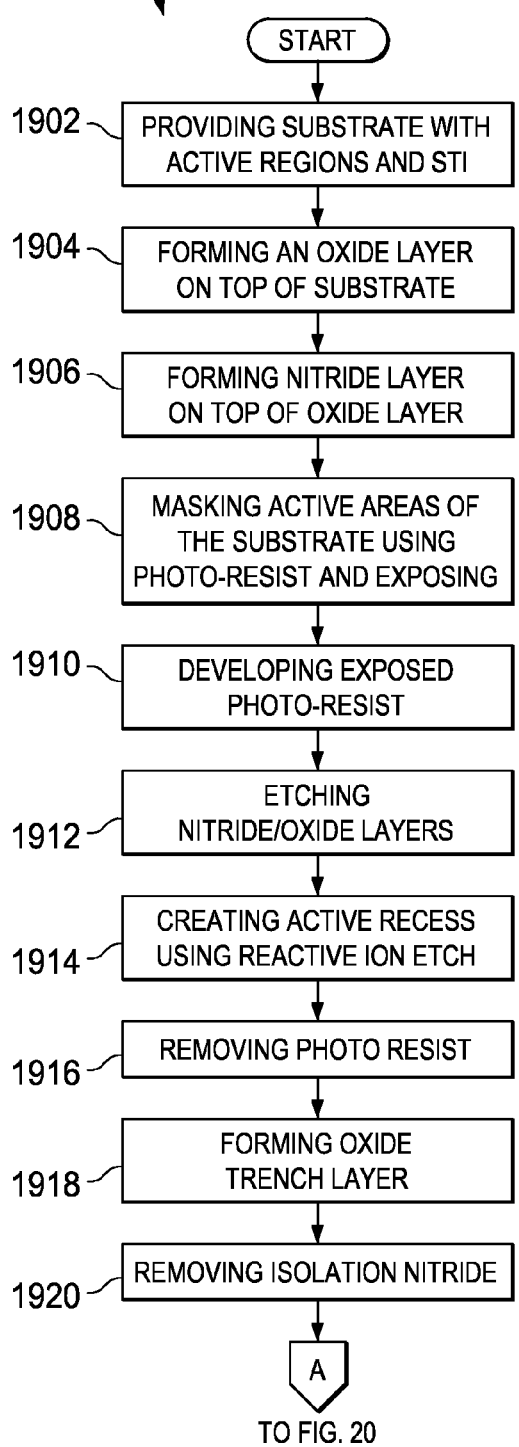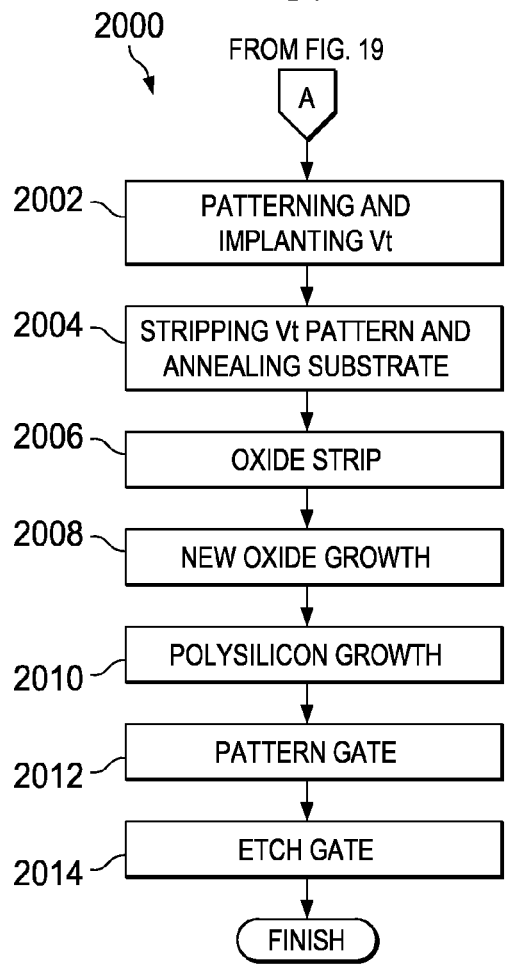

TRANSISTORS WITH RECESSED ACTIVE TRENCHES FOR INCREASED EFFECTIVE GATE WIDTH

FIELD OF INVENTION

The present invention relates generally to the fabrication of integrated circuits and more particularly to methods for creating recessed active trenches for wide transistors in order to increase the drive current ($I_{on}$) of the transistors, while the leakage current ($I_{off}$) remains relatively constant.

BACKGROUND OF THE INVENTION

Integrated circuits are manufactured by fabricating electrical devices on semiconductor substrates and interconnecting the various electrical devices. Shallow trench isolation (STI) is a technique used to electrically isolate transistors or electrical devices and is a facilitating technology for the fabrication of advanced microelectronic devices, for example, complementary metal-oxide-semiconductors (CMOS). STI has largely replaced localized oxidation of silicon (LOCOS) isolation methods in the fabrication of advanced microelectronic devices. STI involves creating oxide isolation trenches for electrical separation or segregation in integrated circuits in order to avoid electromechanical interference (EMI) and/or parasitic leakage paths between the various devices. The oxide trench is etched into the silicon substrate utilizing, for example, reactive ion etching (RIE), followed by employing a thermal oxidation process to line the trench walls with a thin layer of oxide, for example, $SiO_2$. The trench is then filled with a gap-filling oxide isolation material. The structure is subsequently chemically mechanically polished (CMP) to create a planar STI structure such that electrical devices (inner active areas) can be formed within regions bounded by the STI, often referred to as moats.

The gate width ($W_g$) of small transistors, for example, static random access memory (SRAM) transistors is limited by the process constraints of the required "footprint" of the device. Given specific pitch and space limitations, the $W_g$ of the SRAM is constrained within specific physical limits. A small gate width ($W_g$) can lead to small drive currents ($I_{ON}$) in minimum size transistors. An increase in drive current ($I_{ON}$) at no or a small increase in leakage current ($I_{OFF}$), for a given "footprint", would provide a significant benefit over the presently available technology.

FinFET structures, are presently being used in some of the smallest memory devices (e.g., SRAM), are not suitable for wide transistor type applications, for example, large switches. FinFET transistors generally have higher current densities than most CMOS devices; however, the fins of FinFETs are not as wide as the "fins" of wide transistors because most of the FinFET world is aimed at narrow transistors. FinFETs are typically less than 100 nm in width and therefore not suitable for wide transistor applications.

Thus, there exists a need for an improved system and method for creating wide transistors with increased drive current with little or no increase in leakage current. In other words, there exists a need for improving the drive current ($I_{ON}$) per unit width without a proportional increase in leakage current ($I_{OFF}$).

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The present invention relates to methodologies allowing the creation of recessed active trenches for wide transistor semiconductor devices, by which the above mentioned and other difficulties encountered in the prior art may be mitigated.

Toward that end, the invention may be employed to create a device that increases the effective width of the active area for a given transistor spatial footprint, at the existing lithographic limits or technology node, by forming recessed actives within an active area of a substrate. The resultant structure forms a nonplanar active area in which the transistor is subsequently fabricated. The physical gate width of the transistor built on such a recessed active device can be increased without a concurrent increase in the width of the active area.

In accordance with one aspect of the invention, a method is provided for fabricating recessed active trenches for wide transistors (e.g., transistors with a width of 100 nm-10,000 nm). The method comprises forming one or more recessed active structures in an active area of a substrate. In one implementation, the recessed width is about 50 nm and a recess depth is about 20-100 nm. The deeper the recess depth, the more the effective transistor width will be. For example, for a 250 nm wide transistor, 2 shallow recesses of 50 nm width and 20 nm depth would give (250+4*20)=330 nm effective Wg. Alternatively, for a 250 nm wide transistor, 2 deeper recesses of 50 nm width and 100 nm depth would give (250+4*100)=650 nm effective Wg The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIG. 3 is a partial side elevation view in section illustrating an exemplary substrate with recessed STI in accordance with an aspect of the present invention;

FIG. 4 is a partial side elevation view in section illustrating a thin oxide layer formed over a substrate processed in accordance with another exemplary embodiment of the present invention;

FIG. 7 is partial side elevation view illustrating a photoresist mask placed and aligned over the substrate shown in FIG. 6 and unmasked photoresist regions exposed to ultraviolet light, according to another embodiment of the invention;

FIG. 8 is a partial side elevation view illustrating the photoresist on the substrate of FIG. 7 developed according to another embodiment of the present invention;

FIG. 19 is a flow diagram illustrating an exemplary method of fabricating recessed actives in a semiconductor substrate according to another aspect of the present invention; and FIG. 20 is another flow diagram illustrating a continuation of the exemplary method in FIG. 19 according to another aspect of the present invention.

DETAILED DESCRIPTION OF THE INVENTION

Figure 1:
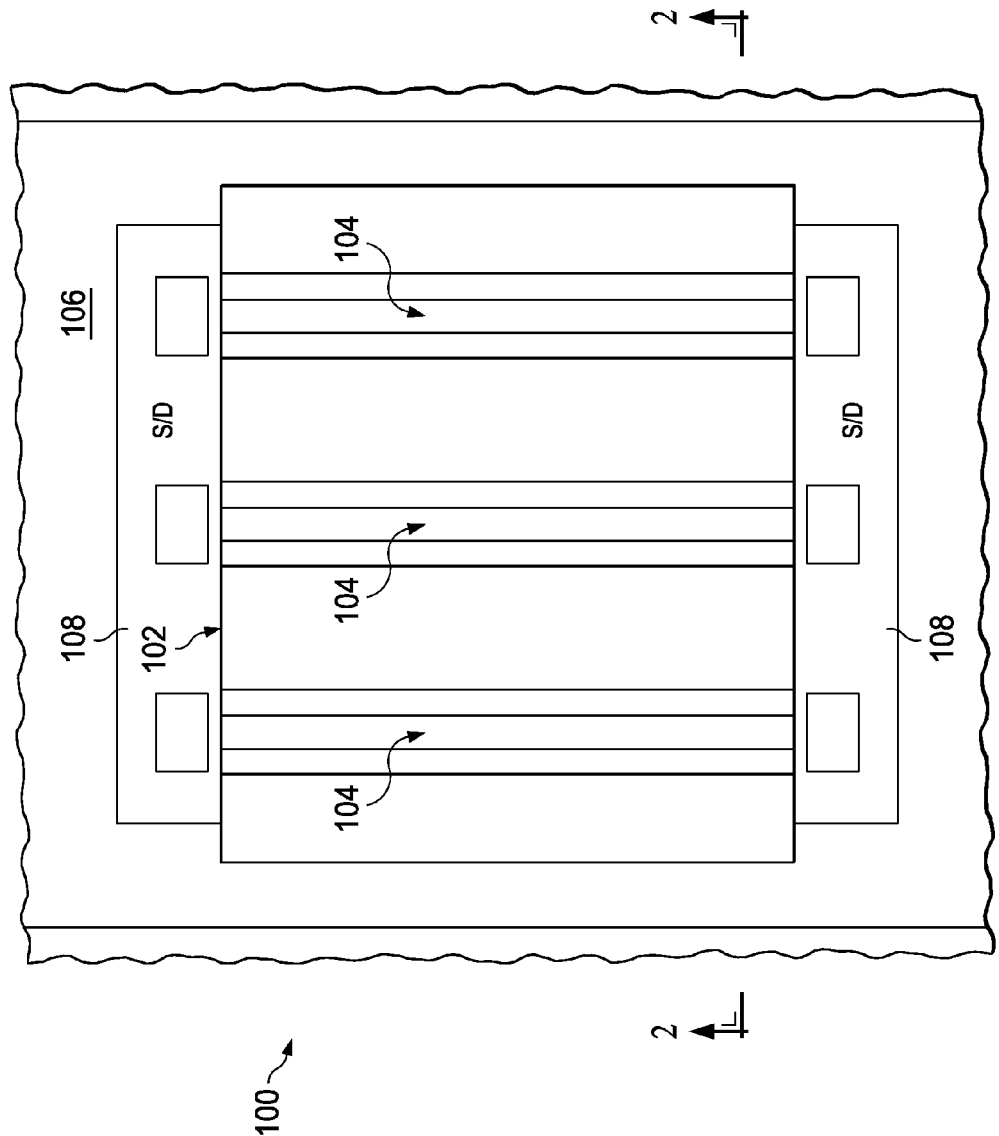
FIG. 1 is a partial top view of a recessed STI moat and a recessed transistor in accordance with an exemplary embodiment of the invention.

One or more implementations of the present invention will now be described with reference to the attached drawings, wherein the reference numerals are used to refer to like elements throughout, and wherein various structures are not necessarily drawn to scale. The method of the present invention will be described with reference to the formation of recessed active trenches for wide transistors. However, the method is applicable to other processes, for example, a process for forming any suitable digital or analog electronic device, for example, large switches, I/O devices, logic devices, analog devices, power IC outputs, switches, large inverter switches, and the like. Furthermore, while the following detailed description is presently contemplated by the inventors for practicing the invention, it should be understood that the description of this embodiment is merely illustrative and that it should not be taken in a limiting sense.

The present invention provides for a method of fabricating recessed active trenches for increased Weffective transistors. The recessed active trenches can be used in conjunction with shallow trench isolation (STI) techniques. STI is a method used to electronically isolate microstructures in semiconductors and microelectromechanical systems (MEMS) devices. Many companies employ STI technology to isolate electronic devices (e.g., transistors) on an integrated circuit in order to prevent current leakage between the various devices. STI has replaced the traditional LOCOS (local oxidation of silicon) structures, in some applications due to STI providing a more controlled form of electrical isolation. LOCOS structures, in contrast, typically consume larger amounts of space because the oxidation region expands the isolation area laterally in proportion to the depth of the isolation.

FIG. 1 illustrates at 100 a top view of an increased Weffective transistor gate 102 with recessed active trenches 104 used in conjunction with shallow trench isolation STI regions 106 according to one embodiment of the invention. The source or drain reside in the active area 108 of the integrated circuit. The process in which STI 106 trenches are etched and filled, for example, with single or multiple isolation, low-k or dielectric materials. The STI 106 trenches in this embodiment form what is known as an STI 106 moat. The isolation materials for the STI 106, can be, for example silicon dioxide ($SiO_2$), $ZrO_2$, $Al_2O_3$, high density plasma (HDP) oxide, combinations thereof, and the like. FIG. 1 illustrates recessed active trenches 104 wherein the recessed active trench depth, for example, is approximately 20-100 nanometers (nm). A recessed active trench space corresponding to a width in the recessed active trench at the top of the polysilicon transistor gate 102 can be about 50 nanometers wide, for example. The process of forming STI 106 within a substrate is well known by those of ordinary skill in the art.

Forming recessed active trenches 104 for wide transistors is not generally performed in the manufacture of, for example, CMOS devices. In the present embodiment, the generation of such a Weffective transistor gate 102 with recessed active trenches 104 is done without creating typical gate oxide integrity (GOI) problems in the end device. The recessed active trenches can result in approximately 100% higher performance or 30% lower area for logic and analog structures compared to the bulk planar structure. This will be discussed in detail infra.

Figure 2:
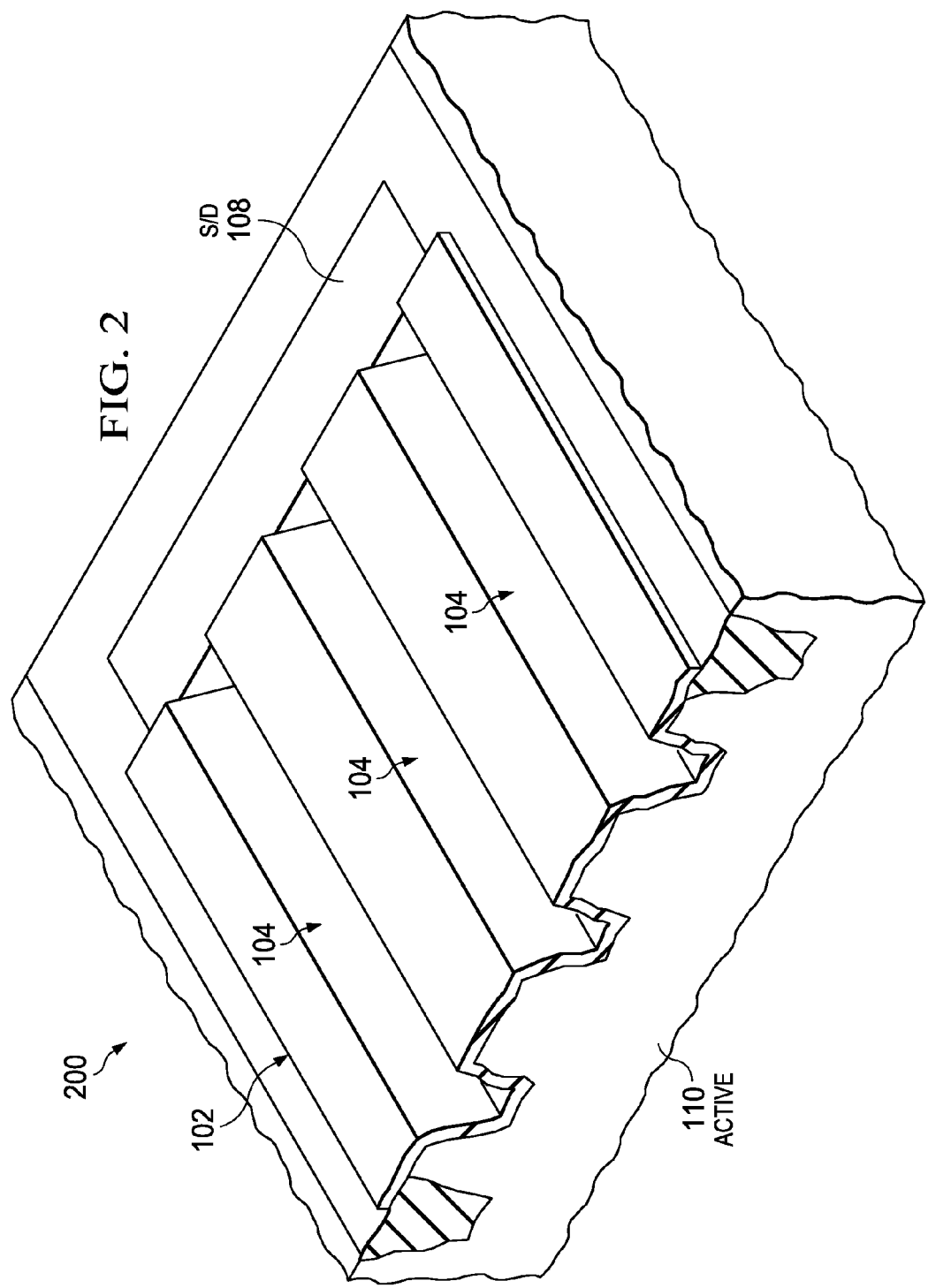
FIG. 2 is a side perspective view of a section illustrating formation of recessed active trenches in a wide transistor according to an embodiment of the invention.

The Weffective transistor gate 102 with recessed active trenches 104 (e.g., a comb transistor) according to one embodiment of the present invention comprises a plurality of active "teeth" "embedded" in a substrate active region 108 that serves as source and drain regions 108 (S/D) and a plurality of the recessed active trenches 104 covered with polysilicon. Impurity diffusion layers are formed in the semiconductor substrate active region 108 employing, for example, a known ion source implantation process, and the like. The impurity diffusion layers or active regions 108 adjoin a gate 102, e.g., polysilicon, etc. The polysilicon gate 102 is formed on a serpentine dielectric layer. The Weffective transistor gate 102 formed as a "comb transistor" or serpentine structure yields a greater drive current ($I_{ON}$) than is normally available for a given integrated circuit device with a comparable spatial footprint. As long as the recessed active depth is greater than one-half the recessed active space, a net increase in $I_{ON}$ can be obtained wherein the leakage current ($I_{OFF}$) remains approximately constant without an increase in the active area. As can be seen, FIG. 2 is a side perspective view of FIG. 1, illustrating at 200 the Weffective transistor gate 102 with recessed active trenches 104. As shown, in FIG. 1 and FIG. 2, a substrate 110 has several recesses 104 formed within the active area 108 of the substrate 110. The recessed active trench depth and recessed active trench space width of the recessed active trenches are dimensions used to determine the increase in drive current ($I_{ON}$) associated with a given recess.

FIG. 3 illustrates at 300 the semiconductor substrate or wafer 110 with STI 106 formed in the substrate 110. The formation of STI within a substrate 110 is well known by those of ordinary skill in the art. The substrate 110 can be, for example, silicon (Si), silicon-germanium (SiGe), and the like. The present process involves etching recessed active trenches into the substrate 110 in addition to the STI trenches 106.

FIG. 4 illustrates the substrate 110, with a thin layer of dielectric 112 formed on the surface of the substrate 110 (e.g., silicon), obtained by oxidizing (rusting) the substrate 110 outer surface at 400. For example, the thin (about 7-30 nm thick) layer of silicon oxide 112, e.g., silicon dioxide ($SiO_2$), and the like, can be grown in a thermal dielectric processing furnace. The dielectric 112 migrates into the substrate 110 outer surface and is often referred to as a "pad-oxide" 112. The silicon oxide 112 acts, for example, as an intermediate layer or barrier between the silicon substrate 110 and silicon nitride that is deposited on top of the pad oxide 112 in the next processing step.

Figure 5:
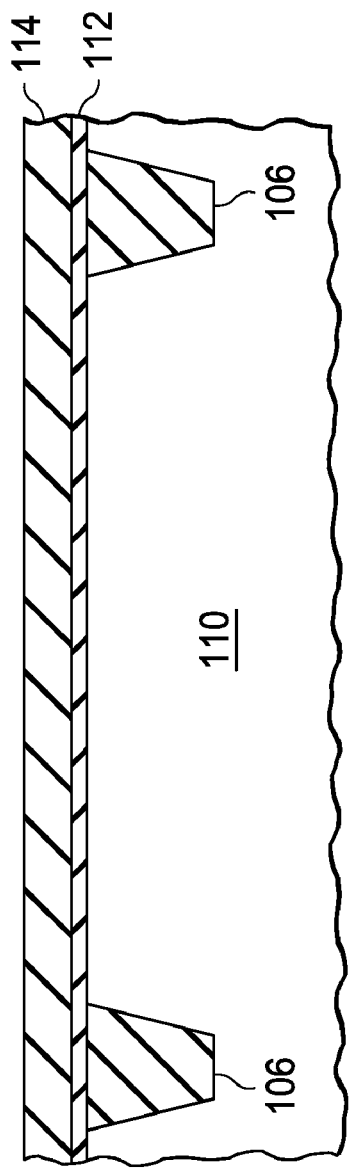
FIG. 5 is a partial side elevation view illustrating a nitride layer formed on top of an exemplary dielectric layer over a substrate, according to an embodiment of the present invention.

FIG. 5 illustrates a nitride layer 114 (sometimes referred to as an isolation pad nitride) deposited on the surface of the dielectric layer 112 to a thickness of approximately 50-300 nm thick, for example, at 500. The nitride layer 114 may be deposited using several techniques which include deposition by evaporation, sputtering, chemical-vapor deposition (CVD), and the like. In evaporation deposition, a solid material is placed in a vacuum chamber and heated until it evaporates. A portion of hot evaporated molecules condense on the cooler wafer surface to form a solid layer of material on the dielectric surface. The thickness of the nitride layer is determined by the temperature profile of the chamber and the amount of time the substrate is exposed to the evaporation process. Sputtering is a technique that employs positive ions that bombard a cathode, which is coated with the material to be deposited (e.g., the nitride). The bombarded material is removed by direct energy transfer and deposited on the wafer/dielectric surface which is electrically coupled to an anode. The types of sputtering systems utilized in nitride depositions of integrated circuits include, for example, DC, radio frequency (RF), magnetic, and the like. Chemical vapor deposition (CVD) employs a process in which the nitride layer is deposited by a chemical reaction in a gas phase which occurs adjacent to the silicon wafer. This deposition process is used to deposit, for example, silicon nitride ($Si_3N_4$), and the like. CVD is typically performed at reduced pressures because the diffusivity of the nitride increases significantly, however it can also be performed at atmospheric pressure, for example. This technique is known by those of ordinary skill in the art as low-pressure chemical-vapor deposition (LPCVD).

The nitride layer 114 can provide protection for an electrical device "active area" formation during shallow trench creation. The nitride layer 114 can be, for example, SiN, silicon nitride ($Si_3N_4$), reaction bonded silicon nitride (RBSN), hot pressed silicon nitride (HPSN), sintered silicon nitrides (SSN), and the like. The dielectric layer 112 and the nitride layer 114 together form what is often referred to as a "hard mask". During pattern transfer to an integrated circuit device, the hard mask layer is consumed during an etching process, for example. However, it is to be appreciated that any hard mask techniques may be practiced in this invention, and that other hard mask materials and masking processes are contemplated as falling within the scope of the invention.

Figure 6:
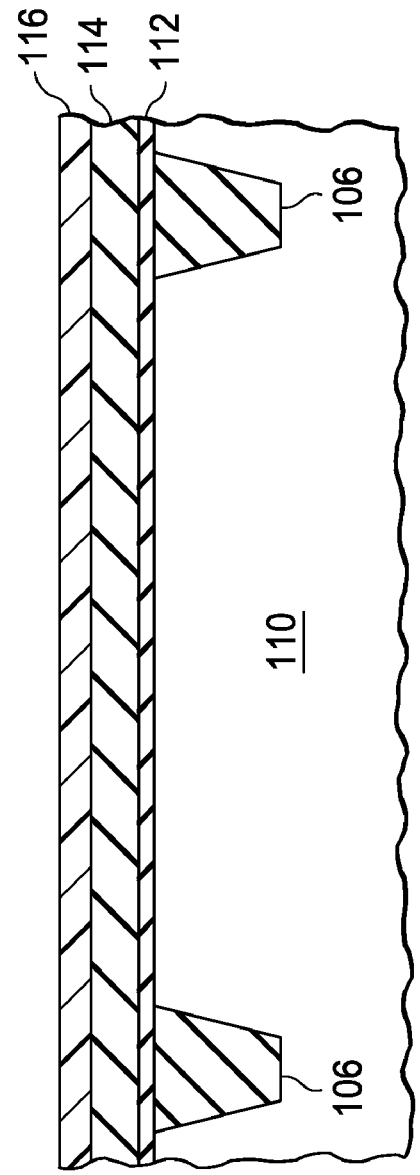
FIG. 6 is a partial side elevation view illustrating a photoresist layer formed on the nitride layer of FIG. 5, according to an exemplary embodiment of the invention.

A conventional photoresist 116 can be applied, as illustrated in FIG. 6 at 600, which, for example, can then be utilized to pattern and etch the nitride layer 114 and the pad oxide layer 112 in order to result in a patterned substrate 110 with STI 106. The photoresist 116 can be, for example, a solvent-based, light-sensitive resin solution that is uniformly applied, for example, on the nitride layer 114 of the wafer, utilizing a spin type process, and the like. The photoresist 116 can, for example, be a chemical, negative photoresist 116 that hardens when exposed to ultraviolet light or other light wavelengths and the unexposed photoresist 116 can be dissolved by employing a developer solvent, leaving openings in the exposed photoresist 116. Another approach involves utilizing a positive photoresist 116 that is initially insoluble, and when exposed to e.g., UV, mercury light, laser, x-rays, electron beam, etc., becomes soluble. After exposure, the photoresist 116 can create the etch pattern needed to form recessed active trenches during, for example, reactive ion etching (RIE).

FIG. 7 illustrates, for example, exposing the layered substrate 110 with STI 106 to ultraviolet light 118 after the nitride 114 outer surface has been coated with a uniform layer of photoresist 116 and the photoresist 116 has been cured sufficiently, in order to define regions of the device 700. The device 700 can be exposed by employing, for example, the ultraviolet light 118 through a pattern mask opening 120. The mask 122 can be, for example, a glass plate on which an image corresponding to the circuit design is registered. The photoresist 116 can be positive photoresist, negative photoresist, or both. Depending on the type of the photoresist 116 either the image or non-image portion of the photoresist 116 can be removed in a photoresist developer. Utilizing positive photoresist 116 in FIG. 7 can result in exposed photoresist 116 softening which can then be washed away utilizing a developing solution, for example.

FIG. 8 illustrates a wafer 110 with STI 106 after exposed photoresist, for example, has been removed in the selected regions 124, at 800. Remaining photoresist 116 has two basic functions; the first function is precise pattern formation and the second function is to provide protection for the device 800 from chemical attack during subsequent etch processes. The photoactive ingredient of the photoresist 116 allows the pattern to be formed after the unwanted portions of the uniformly distributed photoresist 116 have been removed. The development process involves chemical reactions wherein unprotected or developed resist 116 has been dissolved away in a development process. Development can be carried out, for example, by immersion developing, spray developing, puddle developing, and the like.

Figure 9:
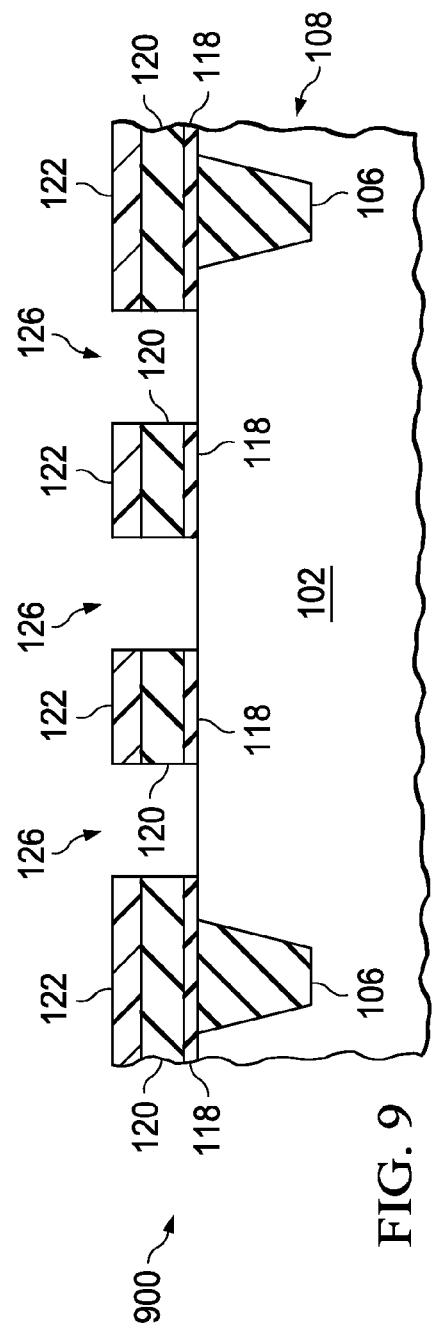
FIG. 9 is a partial side elevation view illustrating the substrate in FIG. 8 with the oxide and nitride layers etched away, according to another embodiment of the present invention.

Next, as represented at 900 in FIG. 9, a plasma etching process can be performed to remove the nitride layer 114 and the dielectric layer 112 (oxide pad) in pre-recessed active regions 126. The pre-recessed active regions 126 can be formed in those areas where the photoresist was removed in the previous process or fabrication step. The pre-recessed active regions 126 are the areas wherein the recessed active trenches can be formed employing a known etch process or technique.

Figure 10:
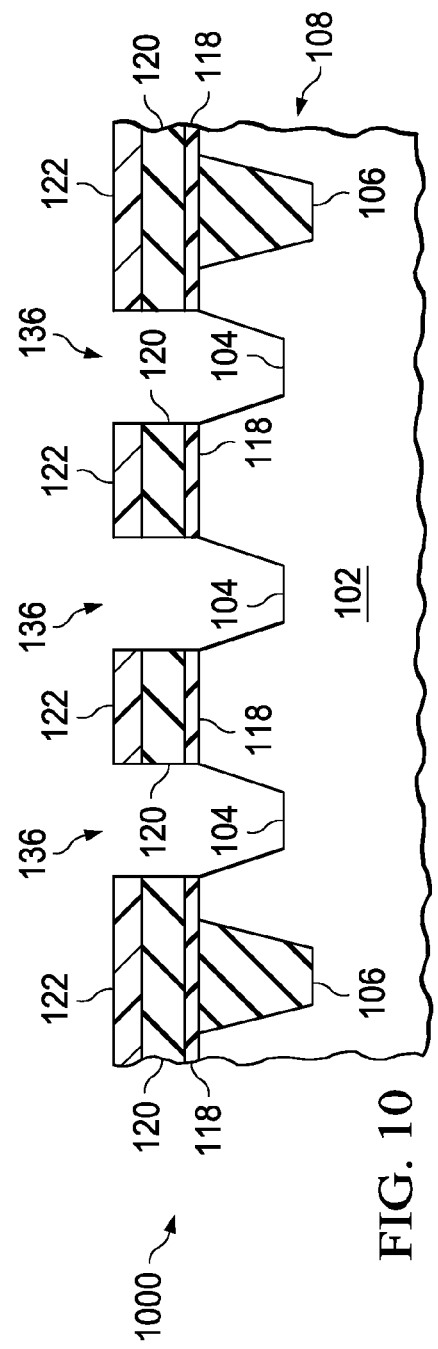
FIG. 10 is a partial side elevation view illustrating the substrate in FIG. 9 with recessed active trenches etched into the active area of the substrate located inside or within the STI moat, according to another embodiment of the present invention.

A gate region 102 of silicon substrate 110, as illustrated in FIG. 10 at 1000, can be etched to form recessed active trenches 104 for Weffective transistors. The gate structure that will eventually be formed on these recessed active trenches 104 increases the $I_{ON}$ of the wide transistor, above that normally available for a given transistor "footprint", for example. Unlike previous methods that lose some of the horizontal width (and have to make up for the loss with additional vertical gate width), this technique maintains virtually all of the horizontal portion of the transistor, but adds vertical walls that contribute to active width. Therefore, the gate width goes from physical width to:

Physical Width+(2×Recess Depth)×Number of Recesses

The recessed active trenches 104 are formed to increase $I_{ON}$ at no significant increase in the corresponding $I_{OFF}$.

This is accomplished by creating the recessed active trenches 104 in active regions 108 of the substrate 102. By selectively masking the active regions of the wafer with photoresist 122 and leaving the selective active regions 136 exposed the etchant can create trenches 104 in a designed fashion. The etching procedure may be, for example, a single step or multi-step process, a wet or dry etch process, by which material is removed in the selected active regions in the semiconductor substrate 102 to form the recessed active trenches 104. For instance, a first plasma etch step may be employed at 136 to eliminate the majority of the silicon wafer trench material, before a second dry etch step is performed to etch away the remainder of the silicon trench material at the openings in the photoresist mask 122, creating the example isolation trenches 104. Any appropriate single or multi-step trench creation process, known by those of ordinary skill in the art, may be employed at 136 in accordance with the present invention.

Figure 11:
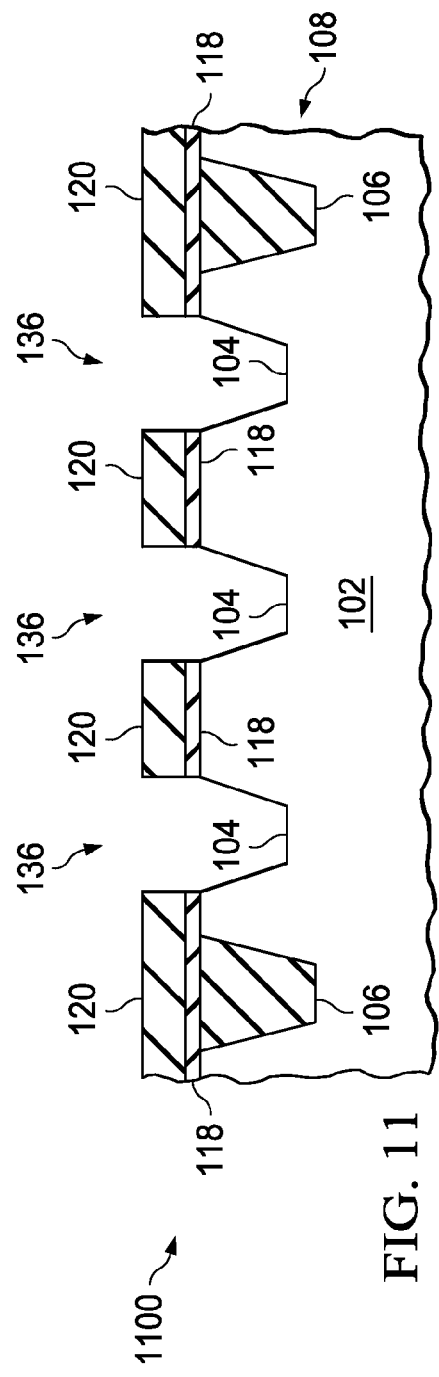
FIG. 11 is a partial side elevation view illustrating the substrate with recessed active trenches and STI in FIG. 10 with the photoresist removed, according to another embodiment of the present invention.
Figure 12:
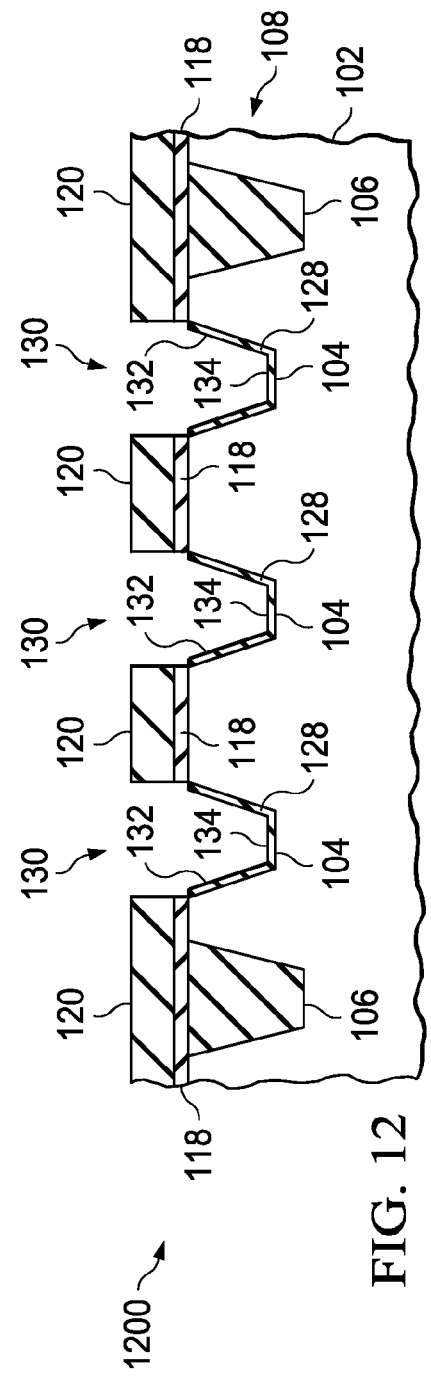
FIG. 12 is a partial side elevation view illustrating the substrate in FIG. 11 with a protective oxide, formed on the trench surfaces, according to another embodiment of the invention.

As illustrated in FIG. 11 a photoresist removal process can be executed at 1100. The photoresist 120 can be removed by employing any known photolytic process or any other process that can be employed to create a pattern mask on an IC device. FIG. 12 illustrates at 1200 the creation of a dielectric trench liner 128 formed over the exposed portions of the trench 104 within a substrate 102. The dielectric trench liner 128 can be formed to a thickness of about 3-20 nanometers, for example. The trench dielectric liner 128 can be formed in any appropriate manner, such as, for example, a thermal dielectric growth process 130 at the exposed trench surfaces, including sidewall recesses 132 and a center space 134 of the etched trench 104. The trench dielectric liner 128 can be employed, for example, to round the corners at the bottom of the trench, to act as a protective layer at the bottom of trench (protects the silicon from damage), to act as a high purity spacer between the silicon and the fill dielectric, and the like. The remaining dielectric pad 118 and nitride layer 120 can prevent oxidation in the active regions when the trench dielectric liner 128 is grown in the exposed trench 104 of the isolation regions. The trench lining process can be, for example, a thermal process, a LVCVD process, a thermal process bi-layered liner, a chemical oxide process in combination with LPCVD film processes, and the like. However, it should be apparent to those of ordinary skill in the art that other trench liner materials (e.g., nitride), multiple isolation liners, no liners at all, and the like are contemplated with this invention.

Figure 13:
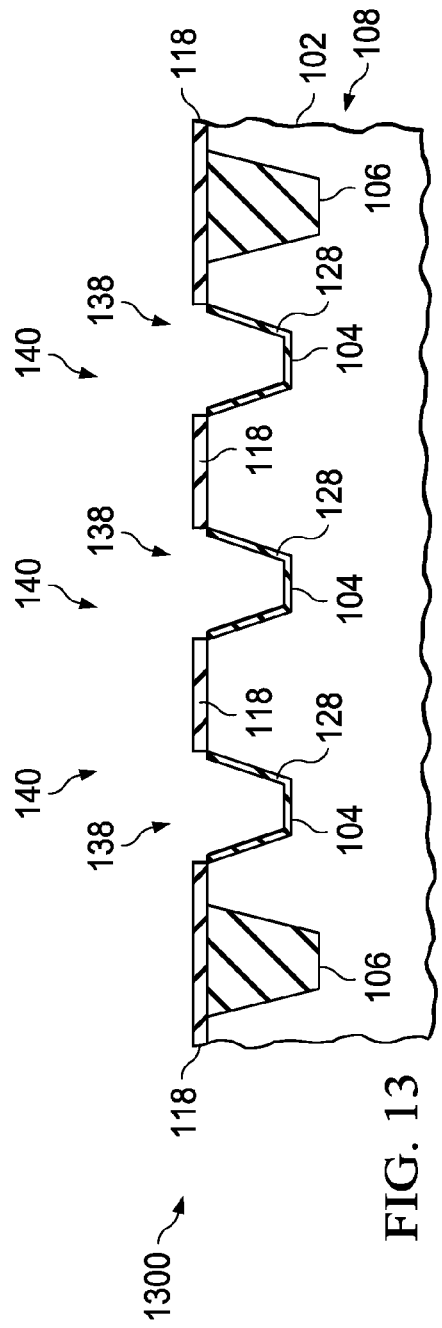
FIG. 13 is a partial side elevation view illustrating the substrate in FIG. 12, where a nitride layer is removed, according to an exemplary embodiment of the invention.
Figure 14:
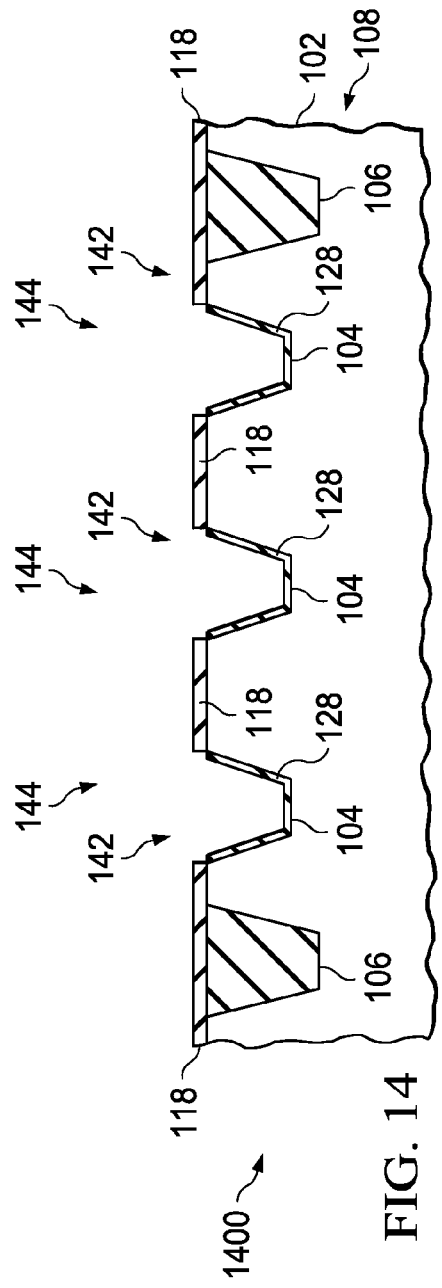
FIG. 14 is a partial side elevation view illustrating the substrate in FIG. 13 where a patterning, a Vt implant and an anneal is performed, according to another embodiment of the present invention.
Figure 15:
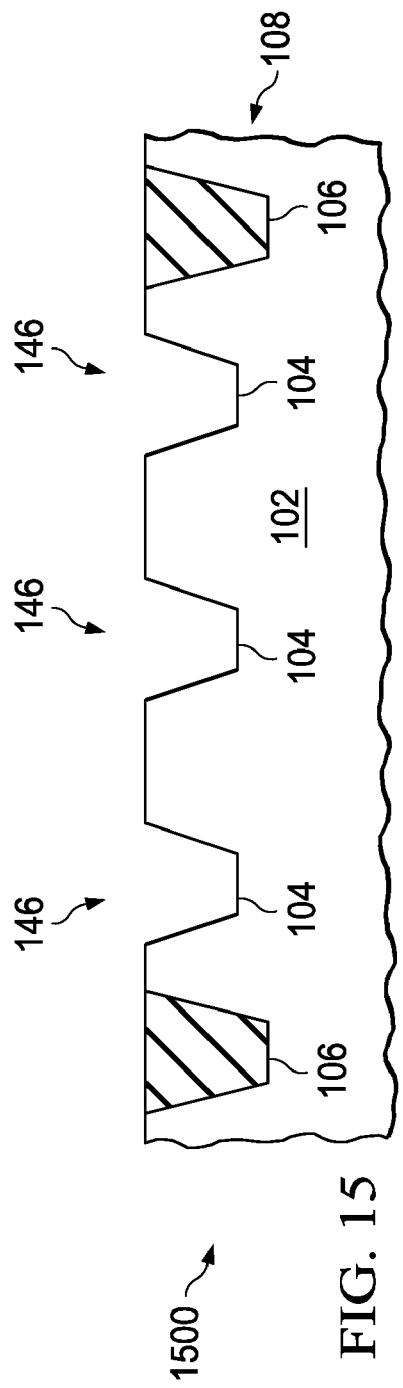
FIG. 15 is a partial side elevation view illustrating the substrate in FIG. 14, following a first layer and second layer oxide strip, according to an exemplary embodiment of the invention.

FIG. 13 represents an embodiment of the present invention at 1300, illustrating an isolation nitride removal 138 with a phosphoric acid at elevated temperature and SC1 megasonic. An optional hot, "standard clean 1" (SC1) cleaning employing HF and hydrogen peroxide ($H_2O_2$) can be utilized employing a vapor dry process 140. SC1 is defined as a cleaning bath in an industrial standard cleaning sequence that can consist of ammonium hydroxide ($NH_4OH$), hydrogen peroxide ($H_2O_2$) and water ($H_2O$) solution designed to remove particles and/or contaminants from a substrate 102 surface. The SC1 process is widely used in the semiconductor industry for many wet-chemical cleaning processes. A subsequent HF clean can be utilized to reduce dielectric defect failures, for example. A $V_t$ implant 142 is carried out in FIG. 14 at 1400 according to an embodiment along with an annealing process. $V_t$ implantation and annealing techniques are widely known in the present art by those of ordinary skill. FIG. 15 represents an embodiment of the present invention at 1500, illustrating an oxide removal 145. Oxide removal is well known by those of ordinary skill in the art.

Figure 16:
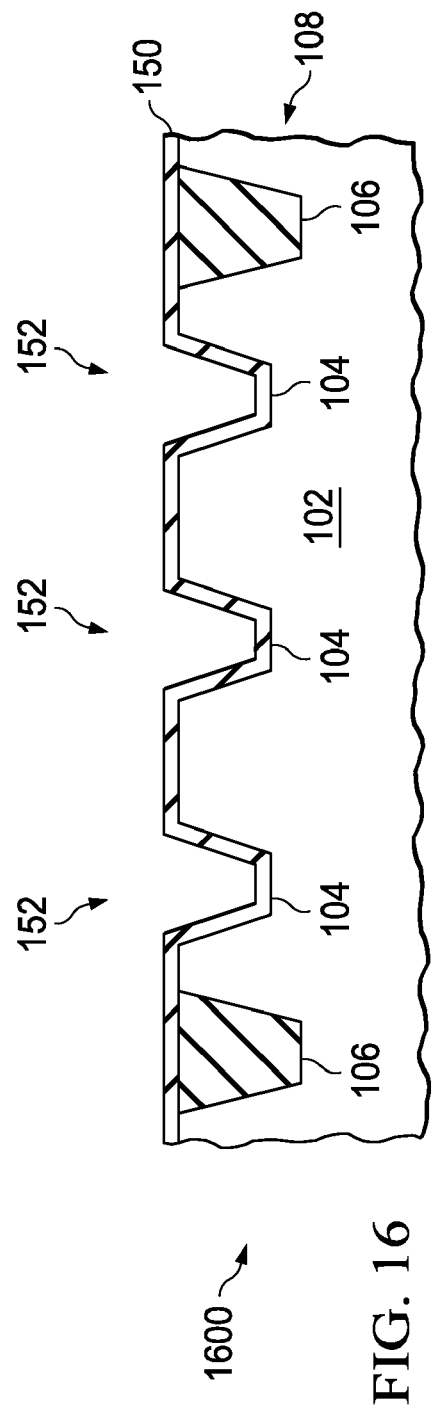
FIG. 16 is a partial side elevation view illustrating the substrate of FIG. 15 where and third oxide layer is formed, according to another embodiment of the present invention.
Figure 17:
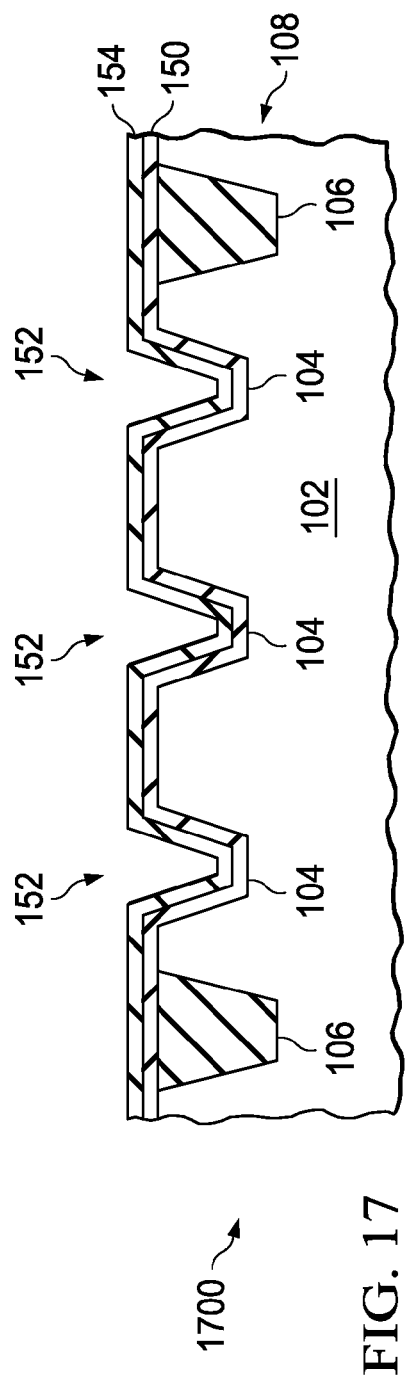
FIG. 17 is a partial side elevation view illustrating the substrate assembly in FIG. 16 with an HDP polysilicon deposited on the substrate assembly, according to another embodiment of the present invention.

FIG. 16 illustrates at 1600 another embodiment of the present invention, a high voltage gate oxide deposition process. The high voltage oxide layer 150 can be applied on top of the substrate surface 102. High voltage devices such as those used in wide transistor applications, for example, switches; require a layer of gate oxide to protect the device against high voltage breakdown. A polysilicon deposition process is illustrated in FIG. 17 at 1700. The gate oxide layer 150 is formed and is covered by a gate electrode material, for example, a polysilicon layer 154. The polysilicon layer can be, for example, be deposited employing, HDP, LPCVD, RTCVD, PECVD, and the like.

Figure 18:
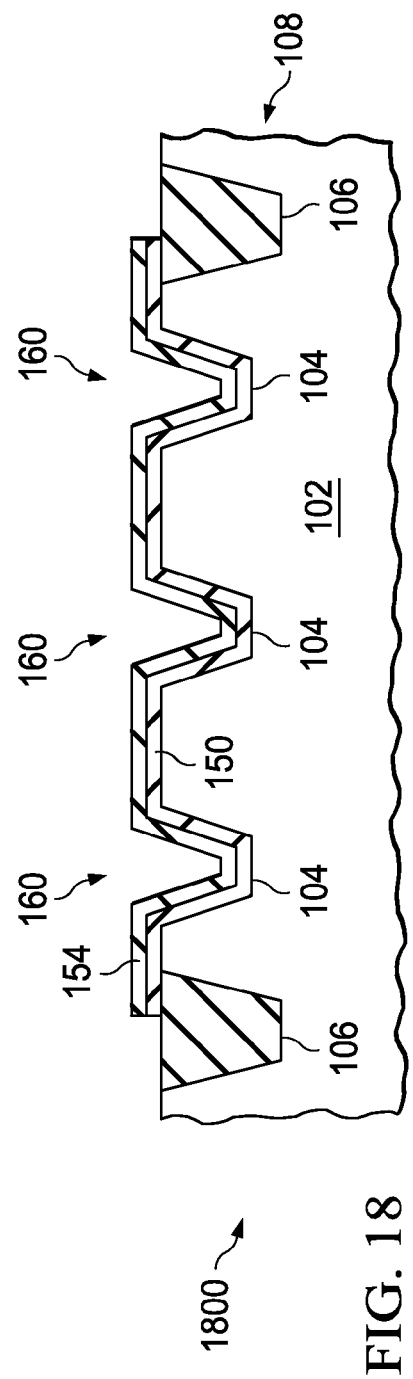
FIG. 18 is a partial side elevation view illustrating the substrate of FIG. 17 during gate patterning and plasma etch, according to another embodiment of the present invention.

FIG. 18 illustrates a gate pattern and plasma etch 160 at 1800. The substrate gate region 102 polysilicon 154 is patterned with, for example, a photoresist that can be reactive ion etched (RIE) in $O_2$. The vertical etch rate of the resist (not shown) can be varied linearly with, for example etch time, plasma power, and the like.

Referring to FIG. 19, an exemplary method 1900, is illustrated for fabricating recessed active trenches in a substrate in accordance with one or more aspects of the present invention. It will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the method 1900 or variants thereof, may be used in manufacturing recessed active trenches in wide transistors, as illustrated and described above with respect to FIGS. 3-18.

Beginning at 1902 of FIG. 19, a substrate with STI is provided with active regions created per ion implantation at 1900. It will be appreciated that the implantation process can take place at various times along the process as is well known to those of ordinary skill in the art. At 1904 an oxide layer is formed over the substrate utilizing a thermal oxide process. Any appropriate process steps and materials can be employed in the formation of the oxide layer at 1904, including oxidation processes as are well known to those of ordinary skill in the art.

At 1906 a nitride layer is formed over the oxide layer at 1904. Known deposition processes by those of ordinary skill in the art can be employed in the formation of the nitride layer at 1906. The nitride layer, as discussed in FIG. 5 above can be, for example, silicon nitride, reaction bonded silicon nitride, hot pressed silicon nitride, sintered silicon nitrides, and the like. At 1908 active areas of substrate are coated with a photoresist and subsequently exposed to light through openings in a photoresist mask, for example. As described in FIG. 6, supra, the photoresist can be, for example, a solvent-based, light sensitive resin solution that softens or becomes soluble when exposed to light (positive photoresist). Any appropriate process steps, materials or energy may be utilized in forming the photolytic mask and exposing the photoresist.

The methodology continues at 1910, where a soluble photoresist (exposed or un-exposed), for example is developed or etched away exposing the outer surface of the nitride layer at 1906. The process step at 1910 results in a pattern being formed on the substrate allowing for trench formation. At 1912 a nitride layer and oxide layer etching process can be performed. As disclosed in FIG. 9 the pre-recessed active regions can be formed in those areas where the photoresist was removed at 1910. Any suitable fabrication steps or materials can be employed in etching the oxide and nitride layers as are known, for example, wet etching techniques, or dry etching techniques, or both.

At 1914 a recessed active trench can be created in the substrate. As discussed in FIG. 10, the etching procedure may be, for example, a single step or multi-step process, a wet or dry etch process, by which material is removed in the exposed isolation regions in the semiconductor substrate to form the isolation trenches.

At 1916 photoresist is removed. The process of removing photoresist is well known by those of ordinary skill in the art. The exemplary method 1900 continues at 1918, for example, with the deposition or forming of a dielectric trench liner that can be formed over the exposed portions of the STI trench. The trench dielectric liner can be deposited or formed in any suitable process step, such as, a thermal growth process at the exposed trench surfaces, including sidewall recesses and center section of the etched STI trench. As discussed supra, the trench dielectric liner can be deposited to act as a protective layer at the bottom of trench, to act as a high purity spacer between the silicon and the fill dielectric, and the like. The trench lining process can be, for example, a thermal process, a LVCVD process, a thermal process bi-layered liner, a chemical oxide process in combination with LPCVD films, and the like. It should be apparent to those of ordinary skill in the art that other trench liner materials (e.g., nitride), multiple isolation liners, no liners at all, and the like are contemplated with this invention.

The exemplary method 1900 continues at 1920, for example, with the removal of the nitride layer. It should be appreciated that any process known by those of ordinary skill in the art to remove the nitride layer is contemplated with this invention. The isolation nitride, for example, can be removed with phosphoric acid at elevated temperature and SC1 megasonic processing.

The exemplary method 1900 continues in method 2000 in FIG. 20 at 2002. An implant layer can be patterned on a substrate with, for example, high topography and high reflectivity forming a patterned layer over the silicon layer; forming doped inhibiting regions within the substrate. Any suitable patterning steps or patterning materials can be employed in patterning the substrate as are known, for example by those of ordinary skill in the art. At 2002, the device is implanted with ion species through the patterned layer to define an implant pattern. A $V_t$ implantation process can then be carried out along with an annealing/repair process, for example. The $V_t$ implantation techniques are widely known in the present art by those of ordinary skill.

The exemplary method 2000 continues at 2004, the $V_t$ pattern is stripped and cleaned utilizing processes known be those of ordinary skill in the art, for example, a hot, "standard clean 1" (SC1) cleaning employing HF and hydrogen peroxide ($H_2O_2$) utilizing a vapor dry process as described in FIG. 16. In addition, for example a subsequent HF clean can be utilized to reduce oxide defect failures. Process steps 2002 and 2004 are repeated as necessary to obtain an acceptable implanted substrate. At 2004, an annealing process can be performed on the substrate assembly to repair damage caused during ion implantation necessary to create the device active areas, for example. At 2006, a pre-gate or pre-furnace formation cleaning step can be executed, for example utilizing SC1, HF and SC2 (HCl, $H_2O_2$, and DI water). The wet etching process at can be carried out using various chemicals, e.g., ammonia, ammonium hydroxide, hydrofluoric acid, hydrochloric acid, and the like to strip the oxide layer.

At 2008 a high voltage oxide is deposited on the outer surface of the substrate and the recessed active trenches. As discussed supra, high voltage devices such as those often used in wide transistor applications, for example, switches, require a layer of gate oxide to protect the device against high voltage breakdown.

At 2010, a polysilicon gate is formed on the substrate (e.g., doped poly silicon), using chemical vapor deposition (CVD) processes as are known by those of ordinary skill in the art and patterned and etched at 2012 and 2014, respectively.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating an integrated circuit including a transistor, comprising:

forming an active region between isolation regions on a semiconductor substrate, the active region including a gate region and a source/drain region;

patterning and etching the gate region to form a plurality of recessed trenches;

forming a continuous gate oxide layer within the plurality of trenches;

forming a continuous gate electrode layer within the plurality of trenches and over the gate oxide layer; and forming source/drains within the source/drain region;

whereby the transistor has an effective gate width that is wider than a width of the gate region.

2. The method of claim 1, wherein patterning and etching the gate region includes forming a hardmask over the substrate; patterning the hardmask; and etching the substrate through openings in the patterned hardmask.

3. The method of claim 2, wherein forming the hardmask includes forming a layer of dielectric material over the substrate within the gate region; and forming a layer of nitride over the layer of dielectric material.

4. The method of claim 2, further comprising carrying out a Vt implant and an anneal after patterning and etching the gate region, prior to forming the gate oxide layer.

5. The method of claim 1, wherein forming the active region between isolation regions comprises forming the active region surrounded by a shallow trench isolation moat.

6. The method of claim 1, wherein the semiconductor substrate comprises silicon.

7. The method of claim 6, wherein the gate electrode layer comprises polysilicon.

8. A method of fabricating an integrated circuit including a transistor, comprising:
  forming an active region surrounded by isolation regions on a semiconductor substrate, the active region including a surface;
  patterning and etching the active region to form a series of recessed trenches separated by unetched portions of the surface within a gate area of the active region;
  forming a gate oxide layer within the series of trenches and over the unetched portions of the top surface within the gate area;
  forming a gate electrode layer over the gate oxide layer within the series of trenches and over the unetched portions of the surface within the gate area; the gate oxide layer and gate electrode layer defining a gate structure of the transistor; and
  forming source/drains of the transistor outside of the gate area within the active region;
  whereby the transistor is provided with an effective gate width equal to a width of the gate area plus two times a depth of the trenches times the number of trenches.

9. The method of claim 8, wherein patterning and etching the active region to form the series of recessed trenches includes forming a layer of dielectric material at the surface within the active region; forming a layer of nitride over the layer of dielectric material; patterning the layers of dielectric material and nitride; and etching the substrate through openings in the patterned layers of dielectric material and nitride.

10. The method of claim 9, further comprising, after patterning and etching the active region to form the series of recessed trenches, forming a trench dielectric layer within the recessed trenches through the openings in the patterned layers of dielectric material and nitride; and thereafter removing the patterned layer of nitride.

11. The method of claim 10, further comprising, following removal of the patterned layer of nitride and with the trench dielectric layer and patterned layer of dielectric material still present, carrying out a Vt implant and an anneal.

12. The method of claim 11, further comprising removing the trench dielectric layer and patterned layer of dielectric material following the Vt implant and anneal, prior to forming the gate oxide layer.

13. The method of claim 9, further comprising, after patterning and etching the active region to form the series of recessed trenches, removing the patterned layers of dielectric material and nitride prior to forming the gate oxide layer.

14. The method of claim 8, wherein forming the active region includes forming the active region surrounded by a shallow trench isolation moat.

15. The method of claim 8, wherein the semiconductor substrate comprises silicon; and the gate electrode layer comprises polysilicon.

16. The method of claim 8, wherein the recessed trenches are approximately 20-100 nanometers deep.

17. The method of claim 9, wherein the recessed trenches are approximately 50 nanometers wide.

* * * * *

UNITED STATES PATENT AND TRADEMARK OFFICE
CERTIFICATE OF CORRECTION

PATENT NO. : 7,642,144 B2  Page 1 of 1
APPLICATION NO. : 11/644259
DATED : January 5, 2010
INVENTOR(S) : Marshall et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 211 days.

Signed and Sealed this

Twenty-first Day of December, 2010

David J. Kappos
*Director of the United States Patent and Trademark Office*